United States Patent [19]

Hofbauer

[11] 4,447,287
[45] May 8, 1984

[54] COMPONENT RETAPING MACHINE

[75] Inventor: John Hofbauer, Des Plaines, Ill.

[73] Assignee: Die-Craft Metal Products, Inc., Des Plaines, Ill.

[21] Appl. No.: 394,288

[22] Filed: Jul. 1, 1982

Related U.S. Application Data

[62] Division of Ser. No. 188,967, Sep. 19, 1980, Pat. No. 4,350,556.

[51] Int. Cl.³ .............................................. B65H 5/26
[52] U.S. Cl. ...................................... 156/552; 53/591; 156/562
[58] Field of Search ............... 156/363, 552, 562, 556, 156/253; 53/200

[56] References Cited

U.S. PATENT DOCUMENTS 3,421,284  1/1969  Zemek ........................... 156/552 X
3,669,309  6/1972  Romeo ........................... 156/552 X
3,878,026  6/1975  Snyder ............................ 156/552

Primary Examiner—David A. Simmons
Attorney, Agent, or Firm—Louis Altman

[57] ABSTRACT

This invention relates generally to production machinery used in manufacturing electrical circuit boards, and in particular to a machine for producing a continuous strip conveyor package for feeding quantities of electronic components into automatic component insertion equipment.

7 Claims, 39 Drawing Figures

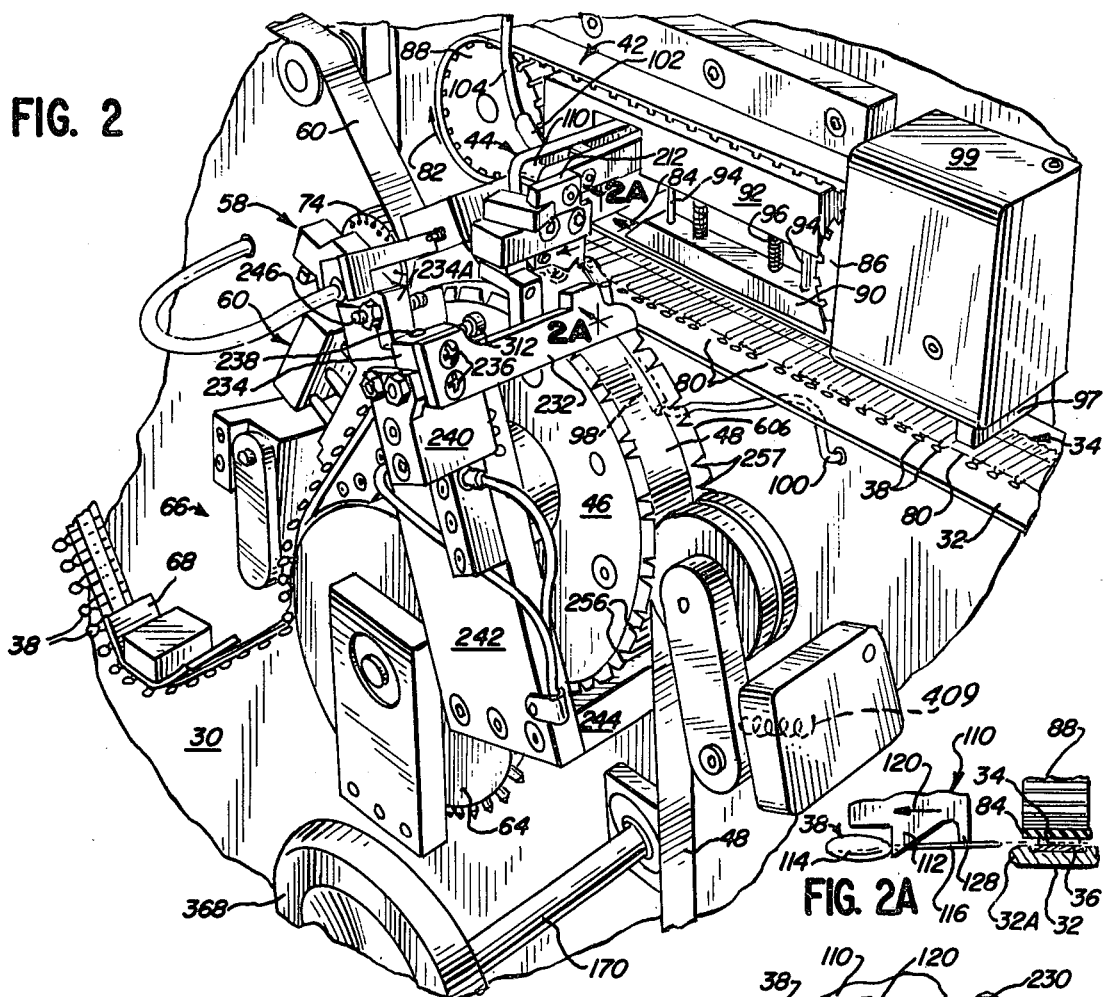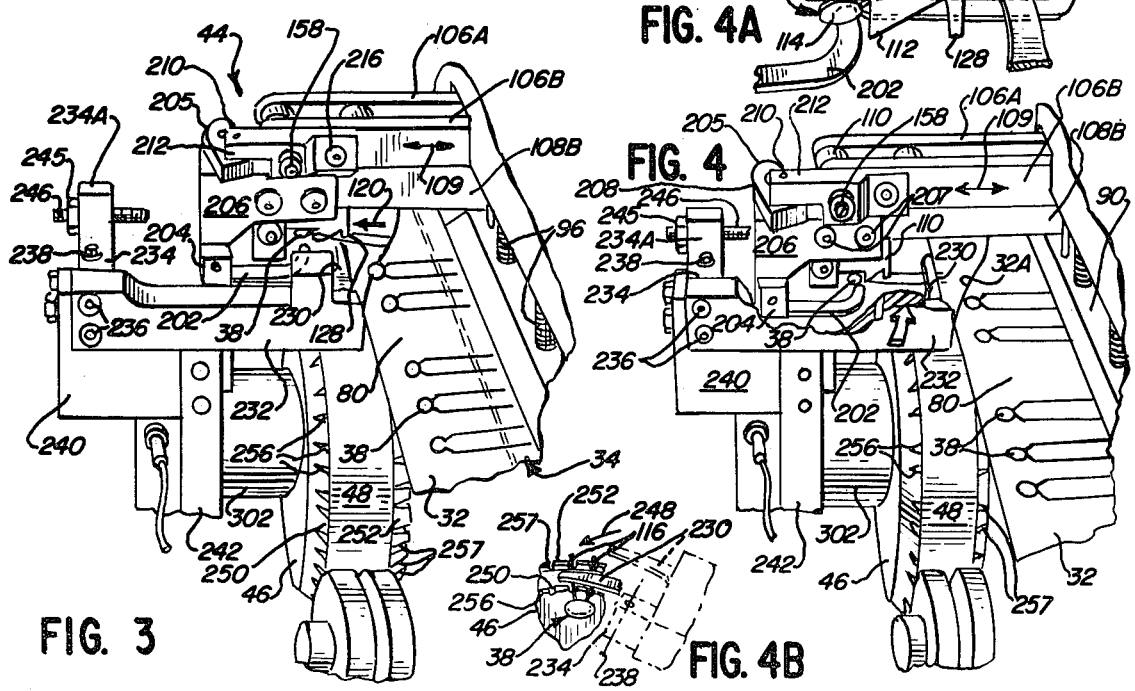

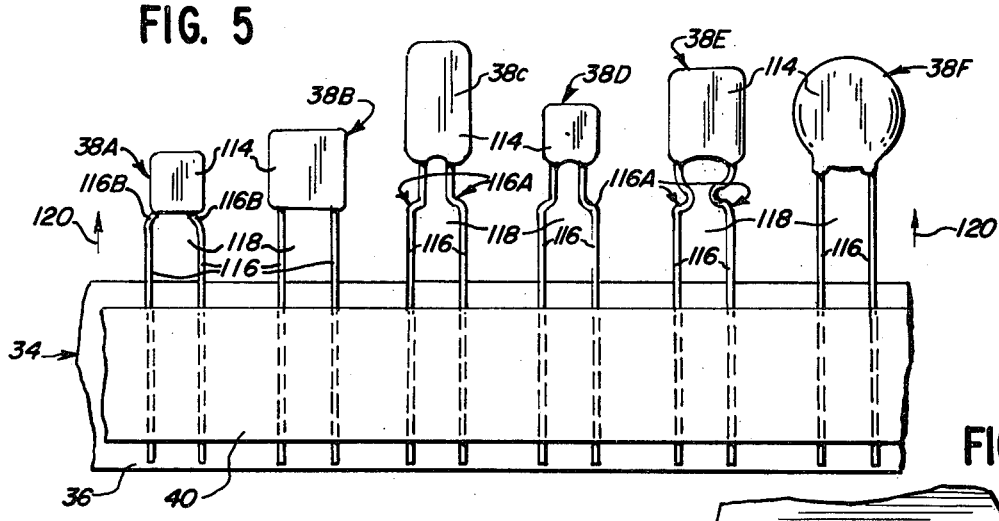
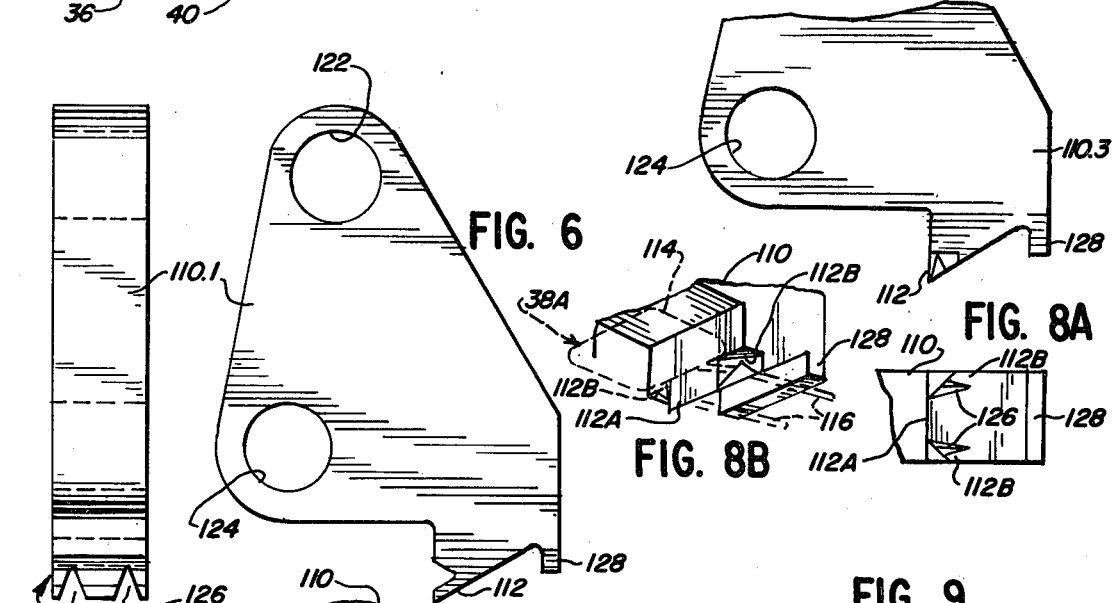
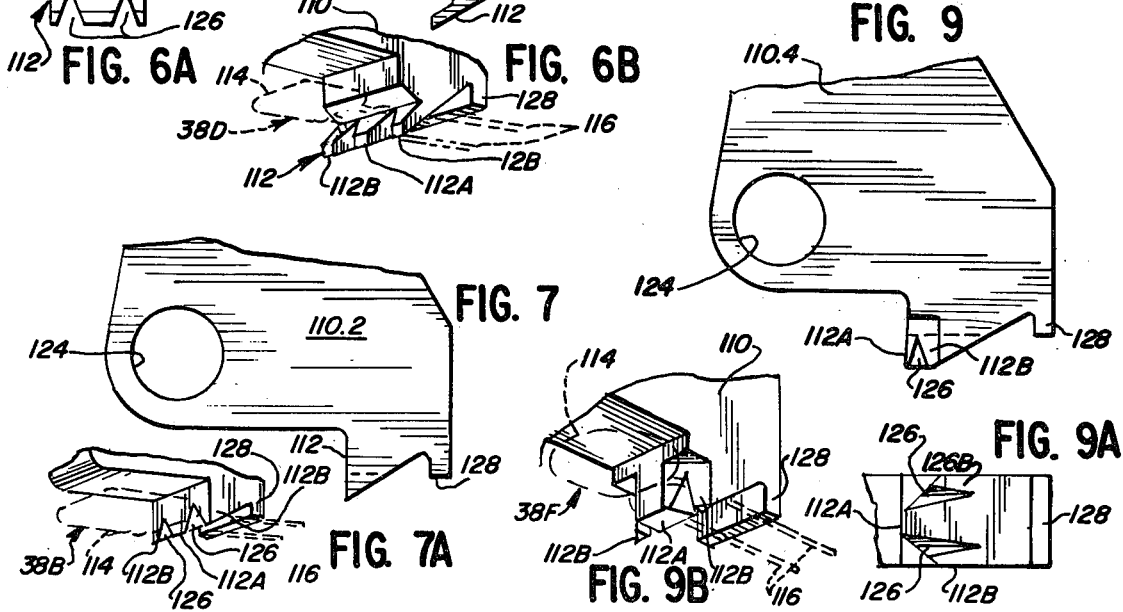

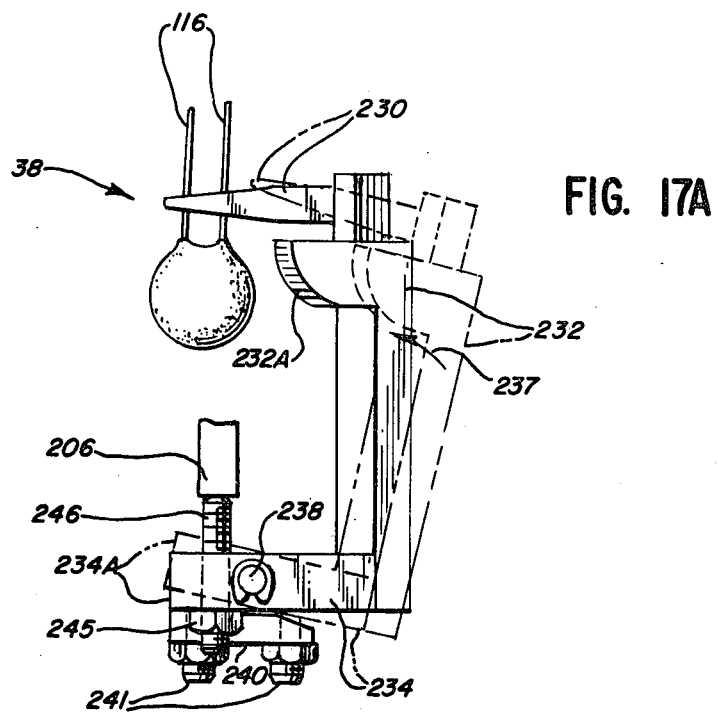
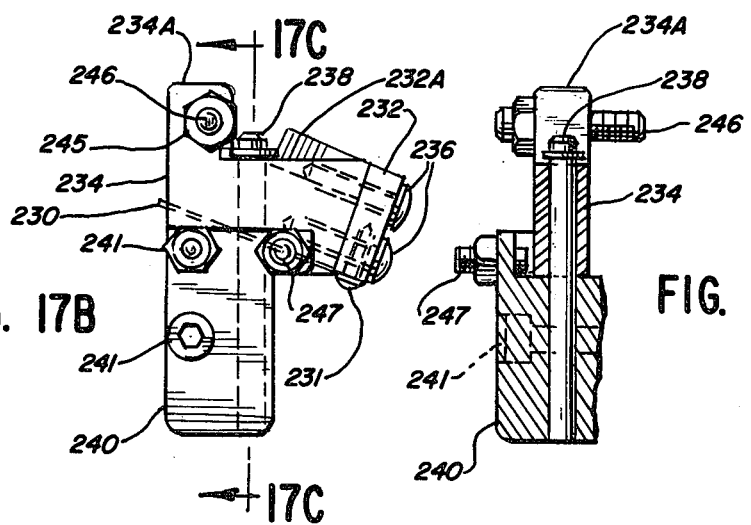

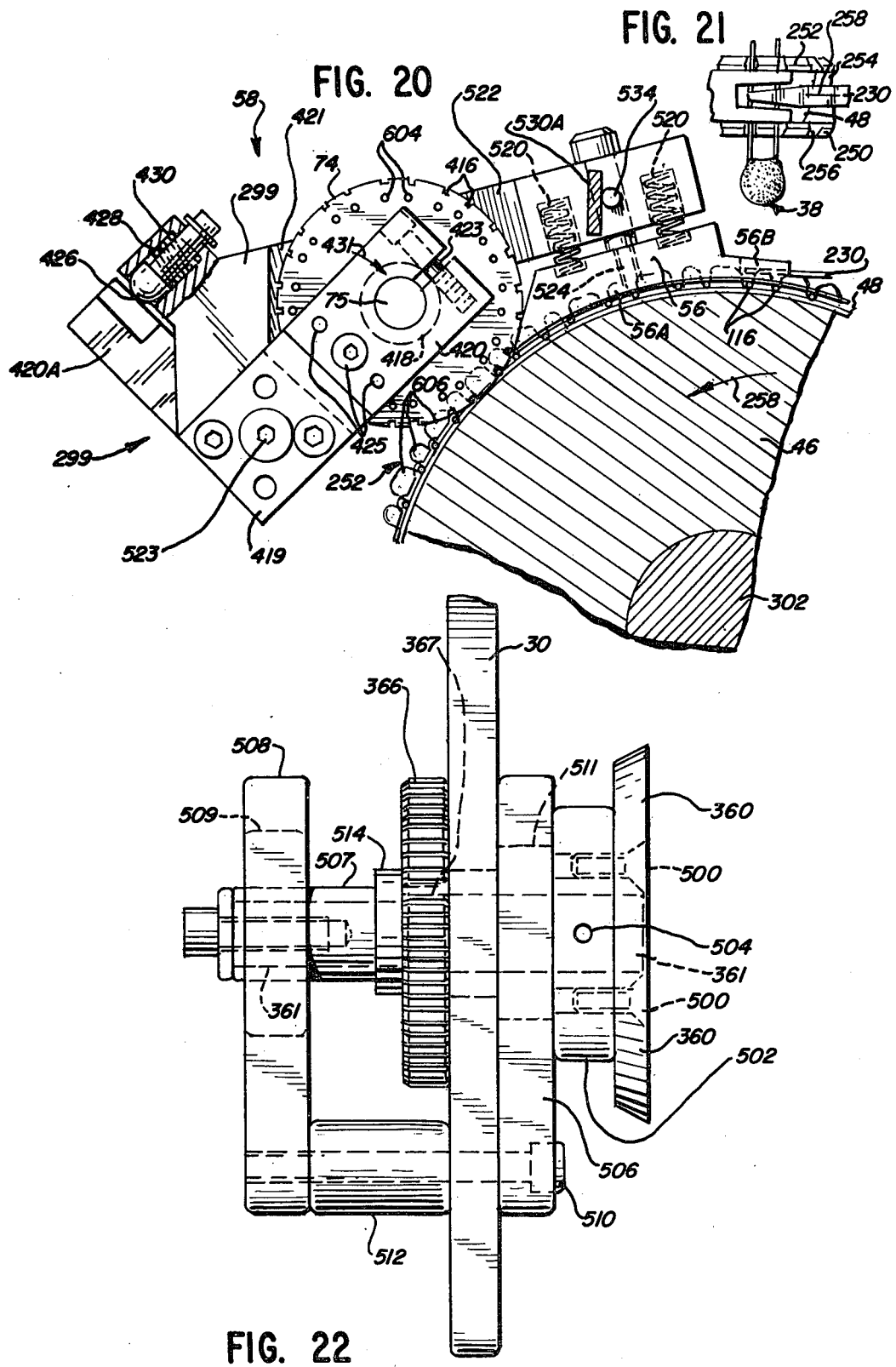

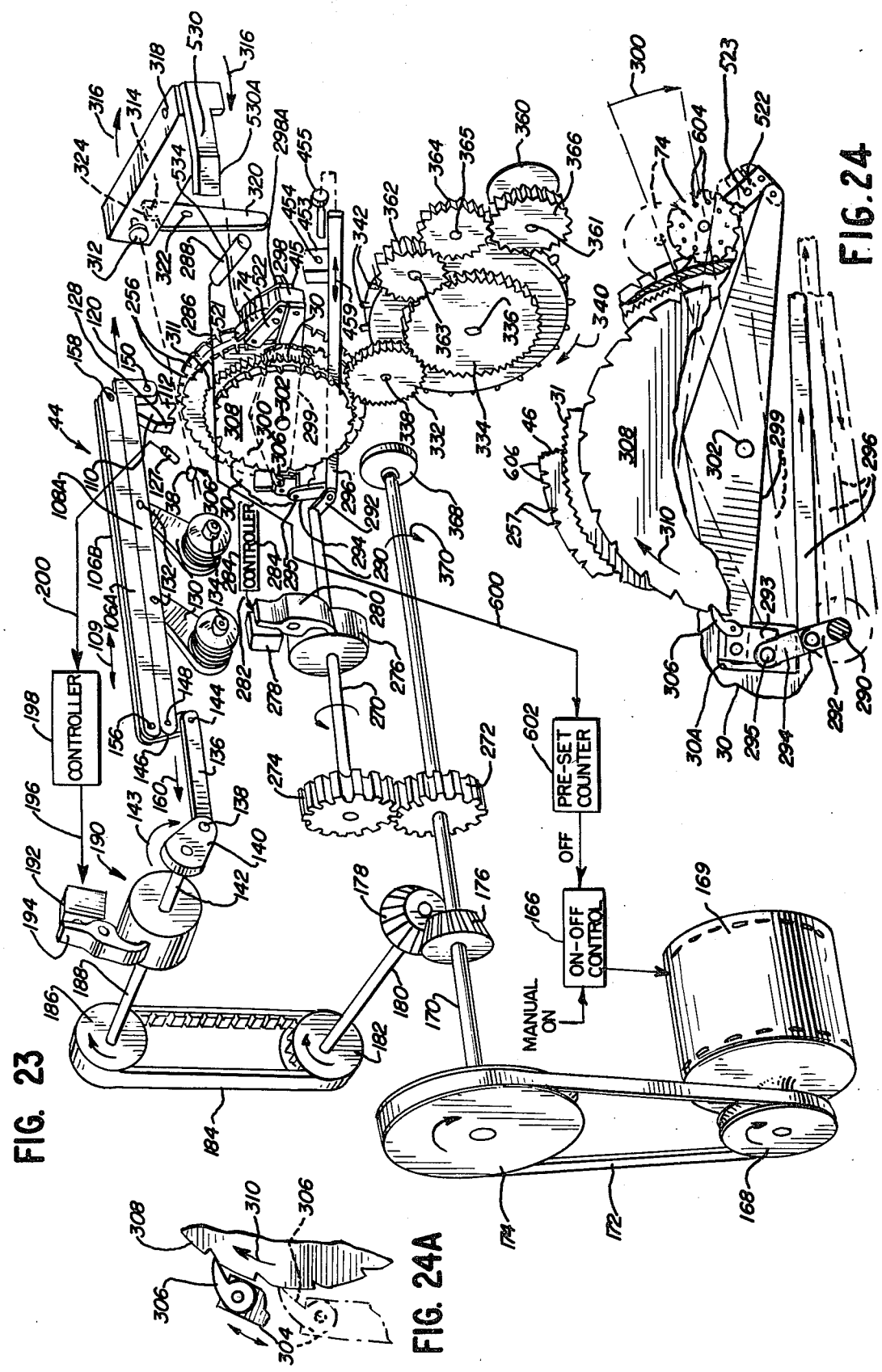

COMPONENT RETAPING MACHINE

This application is a division of application Ser. No. 188,967 filed Sept. 19, 1980 now U.S. Pat. No. 4,350,556.

BACKGROUND OF THE INVENTION

During the automatic manufacture of certain types of electronic components, especially capacitors, the components are organized in a linear array on a disposable strip of chipboard or tagboard. These strips are an integral part of the capacitor manufacturing process. The strips are fed into a wire-forming machine. The machine cuts off lengths of wire from reeled stock, forms each length into a pair of "radial" capacitor leads, and deposits the leads at successive locations along the length of the strip. The leads are then fastened in place, usually by pressing a ribbon of adhesive tape thereover. During subsequent steps in the manufacture of the capacitors (such as insertion of a dielectric disk between the ends of the pair of leads), the strips serve as conveyors for the capacitors. Sprocket holes may be punched in the strips, and they are fed through the machinery by suitable sprocket drives. The following U.S. Patents show capacitor producing machinery of the general type just described: Heibel No. 2,766,510; Packman No. 2,929,130; Weiss No. 3,091,835; Dian No. 3,215,168; and Masuzima No. 4,192,061.

After the capacitors are finished, each strip is fed into an electrical testing device, which detects and removes any capacitors that are not acceptable from an electrical point of view. The output of the testing device is a strip having a gap at each place where a defective capacitor has been detected.

The capacitors must eventually be fed into an automatic insertion machine, which inserts them into printed circuit boards at the proper locations. But the strips which emerge from the testing machines are not suitable for direct input to the insertion machines. One reason for this is the presence of the gaps where the defective capacitors have been eliminated. Therefore the capacitors which pass their electrical test are removed from their old, gap-filled strip and remounted upon a new strip in consecutive order, i.e. without gaps. A machine which transfers capacitors from one strip to another and fastens them with a ribbon of adhesive tape is sometimes referred to as a "retaper".

In some cases there is also another reason for transferring or retaping the capacitors. Some capacitor-manufacturing machines mount the capacitors on short, discontinuous strips. But component insertion machines are designed to receive long, continuous strips wound upon reels. In addition to being short, the discontinuous strips are normally made of a thick chipboard material which would be too stiff to wind on reels even if the strips were longer. Thus a retaper transfers the capacitors from short, stiff chipboard strips to a much longer strip made of a more flexible material, such as tagboard, which is then wound upon a reel.

At least one retaper machine is known to be currently available on the world market. This prior art machine uses a plurality of successively operating puller devices to exert a frictional force on the heads of successive capacitors, thereby removing them from the chipboard strips. The design of these puller devices is such that the thickness dimension of the heads of the capacitors, and the distances from the capacitor heads to the edges of the chipboard strips, must both be within relatively tight tolerances. There is no provision for changing the puller devices to adapt to different types of capacitors. After being pulled from the old strips, the capacitors are allowed to drop in a relatively uncontrolled fashion upon the new strip, to which they are retaped. An indexing wheel is transversely grooved to engage the wire leads of the capacitors at one edge of the new strip. But at the other edge such engagement is not possible, because the ends of the wire leads are prematurely trimmed off where they overhang the tagboard strip. Moreover, the feeding of the ribbon of adhesive tape is not positively synchronized with the indexing wheel. After the new strip leaves the indexing wheel, the subsequent drive is purely frictional, even though sprocket drive holes are later punched in the strip for use after the strip leaves the retaping machine and is fed into the automatic insertion equipment. The machine also requires many different adjustments to accommodate itself to different capacitor sizes, and cannot be adjusted at all to accommodate different capacitor spacings on the old strips.

BRIEF SUMMARY OF THE INVENTION

The objective of this invention is to provide a retaping machine which is superior in several respects to the prior art. In particular the invention contemplates the use of a single puller tool which repeatedly recycles for each successive capacitor, and which positively engages the capacitor rather than exerting a merely frictional pull thereon. The latter feature eliminates the possibility that a capacitor will slip loose from the puller device. It also enables the machine to work with capacitors of any head thickness. The repeating feature reduces the number of such tools needed, and thus makes it simple to change tools to accommodate different types and sizes of capacitors. When straight lead capacitors are employed, the machine can use a puller tool designed to engage the capacitor head; but when kinked lead capacitors are employed, the machine can conveniently be switched over to a different puller tool that engages the kinks in the leads, which is preferable because there is less risk of damage to the capacitors. The tools are also designed to engage the capacitors in such a way that the distance from the capacitor head to the edge of the strip is less critical. After being pulled from the old strip the capacitors are positively controlled during transport to the new strip, instead of merely being allowed to drop onto the new strip gravitationally. The trimming of the wire leads ends is postponed until after the new strip leaves the grooved indexing wheel, so that the grooves can engage the lead wires at both edges of the strip for more positive control. After the new strip and tape ribbon leave the indexing wheel, sprocket holes are punched therein; and a sprocket wheel is then used right in the retaping machine for driving purposes. As a result, the feeding of the adhesive tape ribbon is positively synchronized with the rotation of the indexing wheel. The machine also readily accommodates any desired spacing between the capacitors on the old strips.

In accordance with one feature of this invention, apparatus is provided for removing components from a carrier strip. This apparatus comprises means for receiving a carrier strip having at least one radial lead component releasably secured thereto. The component includes a body and a pair of spaced leads extending in substantially parallel relation from the component body. The component body and the adjacent portions of the leads extend in a lateral direction relative to the input carrier strip and beyond one edge thereof. A puller tool means is provided, which is initially located out of the plane of the input carrier strip, and includes puller projection means extending generally toward that plane. Transport means are provided for transporting the puller tool toward the plane, inserting the puller projection into an entry space bounded by the component body and the laterally extending portion of the leads, in a manner to engage laterally against some portion of the component, and thereafter transporting the puller tool in the lateral direction whereby to pull the component laterally free of the input carrier strip. This structure provides positive rather than merely frictional engagement of the puller tool with the component, and thus operates more reliably in extracting the components from the input carrier strip.

According to another aspect of the invention, apparatus for removing components from a carrier strip comprises means for receiving a generally horizontally oriented carrier strip having at least one component thereon. The component includes a body and at least one lead extending from the body transversely across an upper surface of the carrier strip. The carrier strip also has means releasably securing the lead to the carrier strip surface. Means are provided for pulling the component transversely from the releasable securing means In addition, restraining means are provided which are effective to stabilize the component as it is pulled free. This has the advantage of not allowing the components to fall qravitationally in an uncontrolled fashion after they are extracted from the input carrier strip.

According to another aspect of the invention, apparatus for removing components from a carrier strip comprises means for receiving a carrier strip having a plurality of components releasably secured thereto at locations spaced along the length of the strip. There is a component removal station, and means for advancing the carrier strip past the component removal station whereby to present successive components thereto. Means are provided at the component removal station for removing the components from the strip. Such means includes only a single puller tool adapted to engage a component in a manner suitable for exerting a pulling force thereon, and transport means arranged to operate repeatedly to move the puller tool into operative engagement with each of the components in succession and to retract the puller tool while so engaged, whereby to pull each of the components in succession free of the carrier strip. Because of the fact that only a single, repetitively operated puller tool is employed, instead of a plurality of puller tools successively operated, it is possible for the puller tool to be easily removable and replaceable. This in turn permits convenient interchangeability, so that different tools can be used for different sizes and types of electronic components at different times.

In accordance with another aspect of this invention, a machine for repackaging components is provided which comprises means for receiving an input carrier having a plurality of components releasably secured thereto. The machine also has a component removal station, and means for transporting the input carrrier through the component removal station to present each of the components successively thereto. There is a component receiving station in the machine, and normally inactive means for transporting an output carrier strip through the receiving station. Means are provided for removing the components in succession from the input carrier at the removal station and depositing them in succession upon the output carrier strip at the receiving station. In addition, means are provided for detecting each component upon removal from the input carrier and activating the output carrier strip transport means to advance the output carrier strip a pre-selected distance in response thereto. As a result, the output carrier strip is advanced in preparation for receiving a new component when and only when the presence of such new component has actually been confirmed by the detecting means. If there are any component gaps in the input carrier (which is frequently the case, since the component testing process generally results in a few rejections) then the input carrier is advanced through each capacitor gap without any corresponding movement of the output carrier strip. The output carrier strip is not advanced again until the next filled component position of the input carrier arrives. Thus there are no component gaps in the output carrier strip.

Finally, in accordance with another aspect of this invention, a machine for repackaging components is provided which comprises means for receiving an input carrier having at least one component releasably secured thereto. The component includes at least one lead. The machine has a repackaging station, and means for advancing the output carrier strip lengthwise through the repackaging station. The strip must have a width smaller than the length of the component lead. The strip advancing means includes a drive member in juxtaposition with the strip, and motive means for displacing the drive member lengthwise of the strip. The surface of the drive member which is juxtaposed to the strip has a dimension widthwise of the strip which is greater than the width of the strip, and also has groove means extending across the jaxtaposed surface thereof in a direction widthwise of the strip. The groove means is positioned on each side of the strip. Means are provided for removing the component from the input carrier and depositing it upon the portion of the strip which is juxtaposed to the drive member with the component lead oriented widthwise of the strip and extending beyond both edges of the strip and received within the groove means on both sides of the strip. As a result, the drive member is coupled to the component. Means are also provided for securing the component to the strip so that the component contributes to the advancement of the strip in response to the displacement of the drive member. As a result of this structure, the component is coupled at both edges of the strip in such a manner as to provide a driving connection thereto. This arrangement is considered superior to a single-sided drive coupling.

These and other features, objects and advantages of the invention will become more apparent from the following detailed description of a preferred embodiment, when read in conjunction with the accompanying drawings.

BRIEF DESCRIPTION OF THE DRAWINGS

FIG. 2 is a perspective view of some of the subsystems seen in FIG. 1.

FIG. 2A is a sectional view taken along the lines 2A—2A of FIG. 2.

FIG. 3 is a perspective view of the component removal station of this machine, seen during the component removal operation.

FIG. 4 is a view similar to FIG. 3, but showing the apparatus at a later stage of the component removal procedure.

FIG. 4A is a close-up perspective view of a component in the process of being removed, together with a component puller tool and a pair of restraining tongues which cooperate therewith.

FIG. 4B is a fragmentary perspective view of the component being deposited at a repackaging station, showing two positions of one of the restraining tongues of the previous figure.

FIG. 5 is a top plan view of an input carrier strip containing a plurality of spaced electronic components.

FIG. 6 is a side elevational view of a puller tool designed for pulling certain types of components from the input carrier strip.

FIG. 6A is a front elevational view of the puller tool of FIG. 6.

FIG. 6B is a perspective view of the component engagement claw of the puller tool of FIG. 6.

FIG. 7 is a fragmentary side elevational view of another type of component puller tool.

FIG. 7A is a perspective view of the component engagement claw of the puller tool in FIG. 7.

FIG. 8 is a fragmentary side elevational view of still another type of component puller tool.

FIG. 8A is a bottom plan view of the component engagement claw of the tool of FIG. 8.

FIG. 8B is a perspective view of the same component engagement claw.

FIG. 9 is a fragmentary side elevational view of yet another component puller tool.

FIG. 9A is a bottom elevational view of the component engagement claw of the tool in FIG. 9.

FIG. 9B is a perspective view of the same component engagement claw.

FIG. 17A is a top plan view of the upper component restraining mechanism of this machine.

FIG. 17B is a front elevational view of this mechanism.

FIG. 17C is a sectional taken along the lines 17C—17C of FIG. 17B.

FIG. 20 is a front elevational view of the retaping mechanism of this machine.

FIG. 21 is a fragmentary top plan view showing a component as it makes the transition from the upper restraining mechanism to the retaping mechanism.

FIG. 22 is a side elevational view of the wire lead cutting mechanism of this machine.

FIG. 23 is an overall perspective view of the mechanical drive train of the machine, with supporting elements omitted for clarity of illustration, and certain electrical controls illustrated schematically.

FIG. 24 is a rear elevational view of the intermittent advancing mechanism for the indexing wheel of this machine.

FIG. 24A is an enlarged fragmentary rear elevational view of the ratchet and pawl mechanism employed by the aforesaid intermittent advancing mechanism.

DETAILED DESCRIPTION OF THE PREFERRED EMBODIMENT

Figure 1:
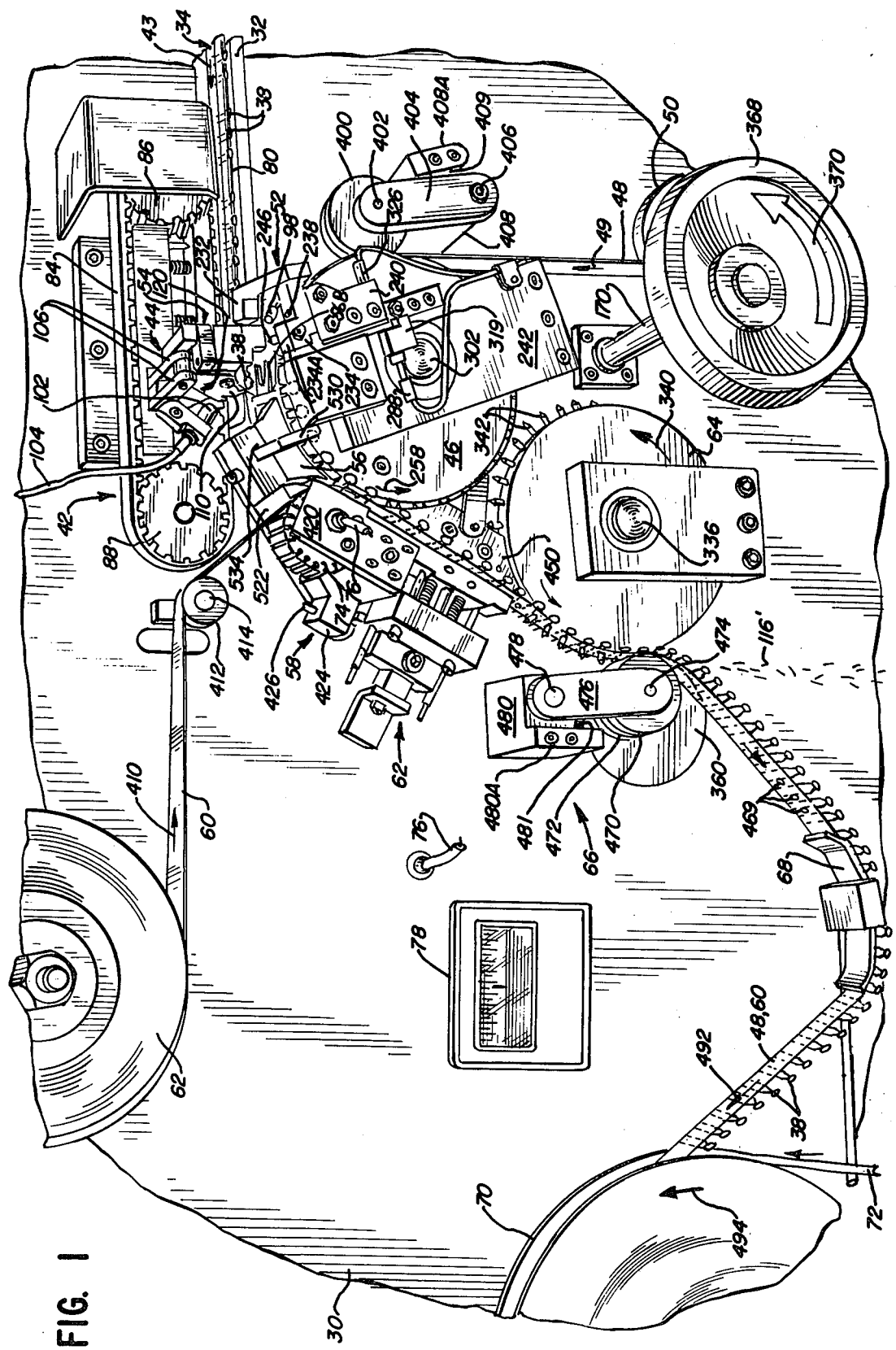
FIG. 1 is a partial front elevational view of a retaping machine in accordance with this invention, showing all of the major subsystems thereof.

FIG. 1 shows the front panel 30 of the retaping machine, together with a number of mechanisms mounted thereon and visible from outside the machine. A receiving shelf 32 is oriented horizontally and juts forwardly from the front panel 30 to receive a succession of input carrier strips 34 which are manually placed on the shelf by the operator of the machine. A more detailed view of the input carrier strip 34 is seen in FIG. 5. The strip comprises a length of stiff chipboard 36 and a row of components such as capacitors 38A, B, etc. which are secured to the strip by a length of adhesive tape 40.

Referring one again to FIG. 1, a continuously operating feed mechanism 42 draws the input strip 34 in the direction indicated by arrow 43, and delivers it to a capacitor removal station 44. At this station there is located a mechanism which removes each capacitor 38 in turn and deposits it upon a continuous output carrier strip of more flexible tagboard material 48 which comes from a supply reel 50 and is fed over the top of an indexing wheel 46 at a repackaging station 47. Various capacitor restraining means 52 and 54 assist in lowering the capacitors 38 from the input carrier strip 34 to the output carrier strip 48. A guide shoe 56 holds the capacitors in place as the index wheel 46 moves them into position to be retaped to the strip at a retaping station 58, using a strip of adhesive tape 60, either of the pressure-sensitive or the thermal type, which comes off a supply reel 62.

After retaping, the output carrier strip 48, with the capacitors 38 and adhesive tape 60 attached thereto, is fed through a sprocket hole punching station 62. This provides the output carrier strip and adhesive with a series of sprocket holes which permit it to be driven by a sprocket drive wheel 64. Thereafter the strip passes through a cutting station 66 where the ends of the wire leads of the capacitors are trimmed off. After leaving the cutting station, the output strip passes under a guide shoe 68 and is reeled up upon a take-up reel 70. There it is interleaved with an intervening strip of protective paper 72 which comes from another supply reel (not shown). When the adhesive tape 60 is of the thermal type, a retaping wheel 74 must be heated by electric current provided by a wire 76. The temperature of the heater wheel is monitored by a suitable measuring device and read out upon a panel thermometer 78.

Each of the various operating stations and sub-assemblies referred to above will now be descirbed individually and in greater detail. With reference especially to FIGS. 2 through 4B, the input carrier strips 34 come in discrete lengths and generally have a few gaps or empty capacitor locations 80 interspersed with the capacitors 38. In addition, the chipboard material 36 (see FIG. 5) which forms the backbone of the input carrier strips is a relatively stiff material unsuitable for reeling up. The purpose of the present machine, therefore, is to remove the capacitors 38 from the input carrier strip 34, ignoring all gaps or missing capacitor locations 80, and to remount these capacitors in gapless succession upon the continuous output carrier strip 48. The latter is made of a more flexible tagboard material which lends itself to packaging in the form of a continuous reel.

As each individual discrete length of input strip 34 is placed upon the shelf 32, it is captured and advanced in the direction indicated by arrow 82 by a conveyor comprising a timing belt 84 and a pair of gear wheels 86 and 88, one of which is driven by a motor and drive train. Since the motor and drive train are entirely conventional and form no part of the inventive concept herein, they are not shown in the drawings. A pressure foot 90 is mounted upon a supporting structure 92 for vertical movement relative thereto by a pair of stripper bolts (not visible), received within respective coil springs 96 which bias the pressure foot downwardly against the conveyor belt 84. A pair of pins 94 guide the vertical motion of the pressure foot. The downward spring bias serves to keep the belt 84 pressed into operative engagement with the input carrier strip 34. A depending barrier wall 97 depends from a protective housing 99. The barrier wall depends low enough to prevent more than one input carrier strip 34 from being seized by the belt 84 at any one time. The housing protects the operator's hand from the timing belt 84 and its drive wheel 86.

The machine must have some means of determining whether a particular capacitor location on an input carrier strip 34 is occupied by a capacitor 38 or is in fact a gap 80. In addition, since the input carrier strips 34 are placed on the shelf 32 manually, at certain times there may be no input strip and therefore no capacitors 38 in the machine at all. Accordingly a light source 98 powered by an electrical wire 100 shines a beam of light through the location at which each successive capacitor 38 is presented to the removal station 44. A photocell 102 senses the light beam from the source 98 and provides an electrical output on a wire 104. Whenever one of the capacitors 38 breaks the light beam, the photocell 102 stops the conveyor mechanism 42 and activates the capacitor pulling mechanism.

As best seen in FIGS. 3 and 4, the capacitor pulling mechanism at station 44 comprises a pair of upper drive bars 106A and 106B which are spaced apart from each other in the horizontal direction, as well as a pair of lower drive bars 108A and 108B. (Drive bar 108A is visible in FIGS. 10 through 13, but not in FIGS. 3 and 4.) The lower bars 108A and B are located directly below their corresponding upper bars 106A and B respectively, and thus are also spaced apart from each other in the horizontal direction. All four drive bars 106A, B and 108A, B reciprocate horizontally in a direction perpendicular to the machine front panel 30 (see arrows 109), and carry with them a capacitor pulling tool 110 which is disposed within the space between the drive bars 106A, 108A and the drive bars 106B, 108B, and is pivotally secured thereto. As seen in FIGS. 3 and 4, and particularly in FIG. 4A, the lower portion of the capacitor pulling tool 110 has a claw 112 which is adapted to engage each capacitor 38 in turn and extract it from the input carrier strip 34.

Note that, as best seen in FIG. 5, each capacitor 38A, 38B, etc., includes a head 114 and a pair of stiff wire leads 116. Conventionally, the head portion 114 of each capacitor includes a dielectric which is inserted between a pair of wire electrodes and encased in a suitable insulating outer material to form the head 114 of the capacitor. The leads 116 are the extensions of the electrodes which emerge from the capacitor heads 114. This machine is designed to work only with capacitors or other components which have the so-called radial lead configuration, i.e. wire leads 116 extending in the same direction from the head wire leads 114. With components of this type, the leads 116 are spaced apart, thus defining an access opening 118 bounded by the leads 116 and the head 114 of each capacitor 38. The depending claw 112 of the capacitor puller tool 110 is designed to be inserted into this access opening 118 for the purpose of getting a grip upon the head or leads of the capacitor 38 so that it can be pulled from the input carrier strip 34. The direction of pulling (which is also the direction in which the capacitor heads 114 and leads 116 extend from the edge of the input carrier strips 34), is lateral, or transversely to the length of the imput carrier strips, as indicated by arrows 120 in FIGS. 3, 4, 4A and 5.

During operation of this machine, capacitors all of the same type would normally be mounted on each individual input carrier strip 34, and indeed on a great many consecutive input carrier strips which are fed into the machine during any one series of capacitor retaping operations. There are, however, a number of different types of capacitor head and lead configurations to which this machine is adaptable. In order to illustrate the major types of capacitors, FIG. 5 has been drawn as though a single input carrier strip 34 might contain different types. Capacitor 38A has the standard CK05 configuration for the head 114, and has a pair of leads 116 which are bent outwardly. The reason for the bent lead configuration is to permit a standard spacing between the leads 116 to be used with the CK05 type of head, which has a width smaller than the standard lead spacing. Capacitor 38B has the standard CK06 type of head configuration, which is larger than the CK05. Accordingly, there is no need to bend the leads 116, and these are straight. Capacitors 38C and 38D have leads configurations which are kinked outwardly. The leads of capacitor 38E, on the other hand, are kinked first inwardly and then outwardly. Finally, capacitor 38F, like capacitor 38B, has straight leads.

Differently shaped capacitor puller tools 110 are required for the various different capacitor configurations which may be encountered at different times. The capacitor puller tool 110.1 depicted in FIGS. 6, 6A and 6B, for example, has upper and lower pivot pin openings 122 and 124 and a depending claw 112 which is designed to engage the access opening 118 of certain capacitor types, namely the capacitors 38C, D and E having pairs of outwardly kinked leads 116. The depending claw 112 is formed with a pair of grooves 126 which are designed to receive the lead wires 116 as illustrated in FIG. 6B. As a result, the depending claw 112 is divided into a central tooth segment 112A and a pair of side tooth segments 112B on either side thereof. The central tooth segment 112A is the part which actually enters the access opening 118 between the capacitor leads 116. The side tooth segments 112B flank the opposite sides of the capacitor leads 116, and provide increased lateral positioning control over the capacitor. In addition, a depending horizontal bar 128 is located rearwardly of the claw 112. This bar rests atop the capacitor leads 116 and also serves to improve control of the capacitor 38 during the pulling operation, as will be more fully explained below.

There are three other types of puller tools illustrated in FIGS. 7 and 7A, FIGS. 8, 8A, and 8B, and in FIGS. 9, 9A and 9B. All four types of puller tools are similar in their general structure, but they differ in the type of capacitor which they are adapted to pull. In particular they differ as to the part of the capacitor against which the pulling force is exerted. Specifically, the central tooth segment 112A of the capacitor puller tool 110.1 in FIGS. 6, 6A and 6B is designed to exert its pulling force against the curved portions 116A which are formed in the kinked wire leads 116 of capacitors 38C, D and E. The advantage of exerting the pulling forces against a curved portion 116A of the wire leads is that it avoids exerting those pulling forces upon the capacitor head 114, and thus lowers the risk of damage to the capacitor. Similarly, the central tooth segment 112A of tool 110.3 illustrated in FIGS. 8, 8A and 8B is designed to exert its pulling force upon the bent lead portions 116B of capacitor 38A.

When necessary, however, the puller tool 110 can be designed so that the central tooth segment 112A exerts its pulling force upon the head 114. This is the situation illustrated in FIGS. 7 and 7A, where the pulling force is exerted by tool 110.2 against the head of a straight lead capacitor 38B, and again in FIGS. 9, 9A and 9B where the pulling force is exerted by tool 110.4 against the head of a straight lead capacitor 38F.

In order to change over this machine from a production run of one type of capacitor 38 to another type, it is only necessary to change a single capacitor pulling tool 110 from one type illustrated herein to another type illustrated herein.

The puller tool is mounted between the upper drive bars 106A and B and between the lower drive bars 108A and B. It is pivotally connected to the upper bars by a pin 158 passing through opening 122, and to the lower bars by a pin 150 passing through opening 124. In order to remove and replace a tool 110, it is only necessary to knock out pins 150 and 158, extract the tool 110 from between the bars, replace it with another one, and reinsert the pins. The fact that only one tool 110 is needed at any one time avoids the need for removing and replacing a plurality of puller tools.

The drive mechanism for the puller tool 110 is best appreciated from FIGS. 10 through 13 and 23. (In FIGS. 10–13 the drive bars on one side of the mechanism, bars 106B and 108B, are removed for clarity of illustration. The missing bars are, however, visible in FIGS. 2 through 4.) The lower drive bars 108A and 108B are mounted upon a pair of rocker members 130 and are pivotally connected thereto by pivot pins 132. These rocker members 130, in turn, are pivotally mounted upon some portion of the frame of the machine (not shown) by means of shafts 134. The rocking motion of the two members 130 about their shafts 134 allows the drive bars 108A and B to reciprocate back and forth in a generally horizontal direction as indicated by the double arrow 109 in FIG. 23. The driving force for this reciprocating motion comes from a reciprocating drive link 136 which is pivotally connected by a pin 138 to a crank 140. The crank in turn is fixedly connected to a shaft 142 which rotates as indicated by arrow 143. The reciprocating drive link is pivotally connected by means of a pin 144 to the end of a rocking drive link 146. The mid-section of this link is pivotally connected by means of a pin 148 to the rear ends of the two lower drive bars 108A and B. As the rotary drive shaft 142 turns, the crank 140 reciprocates the drive link 136, and thereby causes the rocking drive link 146 to reciprocate the drive bars 108A and B.

As these bars reciprocate, the rocking support members 130 rotate back and forth. When, in the course of this motion, they reach an upright position (FIG. 10), they raise the lower drive bars 108A and B to a height such that the puller tool 110 is lifted up above the plane of the capacitors 38 which are on the shelf 32. At this time the puller tool 110 is also slightly to the rear of a capacitor head 114, and tilted so as to lift the claw 112.

The function of the upper drive bars 106A and B is to insert the central tooth segment 112A into, and extract it from, the access opening 118 by tilting the puller tool 110. These upper bars are pivotally connected by means of a pivot pin 156 to the upper end of the rocking drive link 146. In addition, the forward ends of the upper drive bars are pivotally connected to the upper end of the puller tool 110 by means of a pin 158 which passes pivotally through the opening 122 thereof. Because pivotal connection 144 is offset from pivot pin 148, reciprocation of link 136 causes link 146 to rotate about pivot pin 148.

Figure 10:
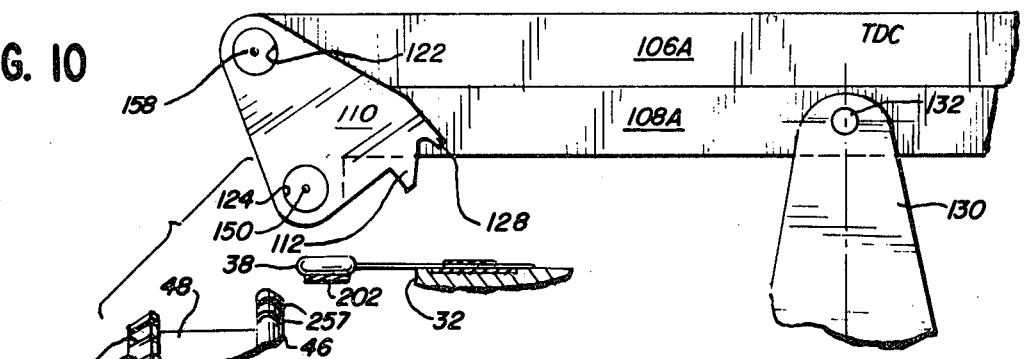
FIG. 10 is a side elevational view of a component puller tool and its associated actuating linkage, seen at a stage of operation just prior to engagement with a component which is to be removed from an input carrier strip.
Figure 11:
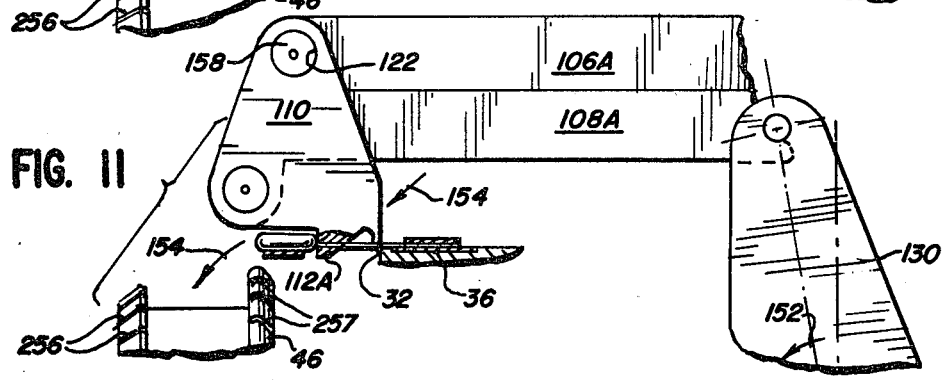
FIG. 11 is similar to FIG. 10, except that it show the puller tool and actuating linkage at the time of engagement of the tool with the component.

As the drive link 136 pushes lower drive bars 108A and B forwardly from the position of FIG. 10 to that of FIG. 11, this motion causes the puller tool 110 to move closer to the capacitor head 114. At the same time, the rotary motion of the rocking support members 130 causes the puller tool 110 to be lowered toward the capacitor 38. In addition, the drive link 136 rotates the link 146 about its center pivot pin 148 in a counterclockwise direction relative to the view of FIG. 23, thus moving upper drive bars 106 rearwardly relative to lower drive bars 108. As a result, pin 158 causes puller tool 110 to rotate (counterclockwise relative to the view of FIG. 23, but clockwise relative to the view of FIGS. 10–13). This rotation of the puller tool 110, which is apparent from a comparison of the initial position in FIG. 10 with the fully rotated position of FIG. 11, further lowers the claw 112.

The described lowering of the tool 110 in general and of the claw 112 in particular continues until the central tooth segment 112A thereof enters into the access opening 118 (FIG. 5), as seen in FIGS. 6B, 7A, 8B, 9B and 11. At this point the central tooth segment 112A is lodged behind either the capacitor head 114, in the case of a straight lead capacitor, or is lodged behind a bent portion of the leads such as 116A or B (FIG. 5) in the case of a bent or kinked lead capacitor.

In either case, the fact that the central tooth segment 112A is lodged directly behind some portion of the capacitor 38 enables the tool 110 to exert a positive pulling force upon the capacitor 38, as opposed to merely a frictional drag. The problem with prior art capacitor pulling tools, which depend upon frictional drag, is that if the capacitor is somewhat undersized, or if the pulling mechanism has become worn over time, it is possible for the pulling mechanism to lose its grip and slip off the capacitor without extracting it successfully from the input carrier strip 34. The positive engagement of the central tooth segment 112A prevents that from happening.

Once the central tooth segment 112A has been firmly lodged behind the capacitor head 114 or the bent or kinked portion of the leads 116, further forward movement (arrow 120 in FIGS. 3 and 12) of the lower drive bars 108A and B causes the puller tool 110 to extract the capacitor 38 laterally from the input carrier strip 34. The adhesive tape 40 which holds the capacitors 38 to the tagboard strip 36 is not strong enough to resist this force. After extraction the capacitor 38 is moved horizontally forwardly from the shelf 32 (see FIG. 11) to the index wheel 46 (see FIG. 12). At the same time, continued rotation of the rocking support members 130 causes the drive bars to move downwardly from the level of the shelf 32 to that of the indexing wheel 46. As a result, the pulling tool 110 not only transports the capacitor 38 in the horizontal direction, but also allows it to be lowered onto the output carrier strip 48 covering the indexing wheel 46.

Figure 12:
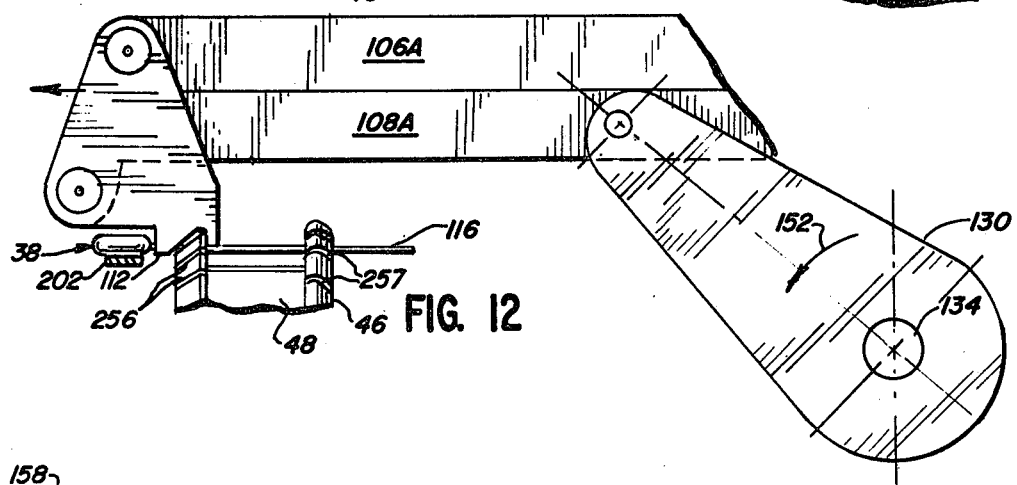
FIG. 12 is similar to FIG. 11, except that it shows the puller tool and actuating linkage at a stage of operation when the component has been removed from the input carrier strip and is being deposited upon an output carrier strip.

During the forward stroke of the lower drive bars 108A and B and the puller tool 110 (arrow 120), the reciprocating drive link 136 is thrust in a forward direction by the crank 140. This causes the rocking drive link 146 to rotate counterclockwise (relative to the view of FIG. 23) about its central pivot pin 148, assuming the position seen in that view. As a result, link 146 pulls the upper drive bars 106A and B into a rearwardly retracted position, as illustrated in FIGS. 11 through 12 and 23, relative to the lower drive bars 108A and B, owing to the pivotal connection 156 between the upper bars and the link 146.

But at the conclusion of this forward stroke, the crank 140 begins to draw the reciprocating link 136 rearwardly (arrow 160). Owing to the pivotal connection 156, this advances the upper drive bars 106A and B relative to the lower bars 108A and B, as indicated by the arrow 162 in FIG. 13. Consequently, the pin 158 then causes the upper end of the puller tool 110 to be thrust forwardly, and the entire tool 110 to rotate about pivot pin 150. The direction of rotation, as indicated by arrow 164, is now from the phantom position of puller tool 110 to its solid line position in FIG. 13. This causes the depending claw 112 to be lifted up out of engagement with the capacitor 38 (i.e., puller tool 110 returns to its initial position seen in FIG. 10). Consequently the puller tool 110 and its drive bars 106A, B and 108A, B can then be pulled rearwardly by the crank 140 and drive link 136 without disturbing the capacitor 38 which has just been deposited upon the output carrier strip 48 and indexing wheel 46.

Power to drive the shaft 142 comes from a conventional continuously running electric motor 164. The motor is turned on and off by a switching circuit 166. A motor output pulley 168 drives a takeoff shaft 170 by means of a belt 172 and a driven pulley 174. Gears 176 and 178 transfer power to a shaft 180 and a gear 182. The latter drives a timing belt 184 and a gear 186. The latter, via a shaft 188, energizes a wrap spring clutch mechanism 190. The latter is a one-shot one-way clutch mechanism which normally declutches driving shaft 188 from driven shaft 142; but connects them for one rotation each time a suitable electrical impulse is received by a solenoid 192 to actuate a pawl 194. This pawl temporarily activates the clutch mechanism 190, causing it to drive the shaft 142 through one complete revolution. Wrap spring clutches and pawl mechanisms of the kind described herein are standard components, available from (among others) the P.S.I. Divison of Warner Electric Company, Pitman, New Jersey.

The releasing signal for the solenois 192 arrives over a line 196 from a controller circuit 198 every time the latter is actuated by an impulse arriving over a line 200 from the capacitor sensing photocell 102. Thus, every time a new capacitor 38 moves into position to be extracted from the input strip 34 by the capacitor pulling mechanism 44, the light beam is interrupted, the photocell 102 sends an impulse to the controlling circuit 198, causing the solenoid 192 to release the wrap spring clutch 190, and a complete turn of the drive shaft 142 ensues. Each turn of that shaft produces one full cycle of forward and rearward motion of the drive bars 106 and 108, causing the puller tool 110 to go through the motions necessary to extract one capacitor 38 and then return to its original position to await the arrival of the next capacitor.

It is not considered satisfactory merely to allow the capacitors 38 to be pulled horizontally from the input carrier strip 34 and dropped onto the output carrier strip 48 and indexing wheel 46 by the puller tool 110. One of the features of the invention is that the downward motion of the capacitors 38 which deposits them upon the output carrier strip is carefully controlled, not a gravitational free fall.

The first of several restraining means which control the capacitors is the horizontal bar 128 located at the lower end of the capacitor pulling tool 110, and to the rear of the depending claw 112 thereof. As best seen in FIGS. 3 and 4, the shelf 32 is formed with a curved edge 32A which narrows the horizontal width of the shelf at the point where the capacitors 38 approach the puller tool 110. Thus, as successive capacitors move into position to be extracted from the input carrier strip 34, the capacitor head 114 and the adjacent portion of the leads 116 extend forwardly from the shelf 32, and are no longer supported thereby. This is necessary to permit the depending claw 112 of the puller tool 110 to enter the access space 118 without striking the shelf 32. But it also creates a problem, in that the capacitor 38 is in danger of falling headfirst off the shelf 32 once it has been pulled free of the restraining influence of the adhesive tape 40. The restraining bar 128 helps to prevent this from happening.

As the puller tool 110 is lowered into engagement with the capacitor 38, portions of the leads 116 located somewhat behind the head 114 are engaged and held down by the bar 128, preventing the entire capacitor 38 from falling off the curved front edge 32A of the same shelf 32.

The second means for restraining the capacitor 38, as it is pulled from the input carrier strip 34, is a supporting blade 202 which is normally positioned to engage the underside of the capacitor head 114, and thus prevents it from tipping downwardly and causing the entire capacitor to tumble off the shelf. See FIGS. 4, 4A, 18, 18A and 18B. This blade is attached, by means of a bolt 203, to the underside of a carrier arm 204. This arm in turn is affixed to a pin 205 which is pivotally supported upon a mounting block 206. The block is fixedly secured to one of the lower puller tool drive bars 108B by bolts 207. Above the block 206 a driven link 208 is fixedly secured to the upper end of the pin 205. Since mounting block 206 is secured to the drive bar 108B, and carries the link 206, pin 205, arm 204 and blade 202 with it, this entire assembly recpirocates with the drive bar 108B as it goes through its puller tool drive cycle described above. Therefore, as the puller tool 110 extracts each capacitor 38 from the input carrier strip, the supporting blade 202 moves in step with the capacitor, and remains in supporting relationship below the capacitor head 114.

But at the end of each capacitor pulling cycle, the blade 202 must be withdrawn so that the capacitor 38 can be deposited on the output strip 43 and indexing wheel 46. Therefore driven link 208 is pivotally connected by means of a pin 210 to a driving link 212 which in turn is secured to one of the upper puller tool drive bars 106B by fastener 216 and also by puller tool shaft 158. Thus, while mounting block 206 reciprocates with the lower drive bar 108B, the driving link 212 reciprocates with the upper drive bar 106B, which overrides the lower bar 108B at the end of each capacitor pulling cycle, as previously described.

When the lower drive bars 108A,B reach the forward limit of their motion, and the upper drive bars 106A,B then move forwardly relative to the lower bars, the driving link 212 (which is mounted on the upper bar 106B) moves forwardly therewith relative to the mounting block 206 (which is secured to the lower bar 108B). As a result, the drive pin 210 causes the driven link 208 to rotate about the axis of pin 205 (see arrow 218 in FIG. 18A). Thus the driven link 208 goes from the solid line position of FIG. 18A to the phantom position thereof. This causes the pin 205 to rotate about its axis, swinging arm 204 with it. This causes blade 202 to move from the position seen at the upper portion of FIG. 18A (in which it supports the capacitor head 114), to the position seen at the lower portion of FIG. 18A (in which it no longer supports the capacitor head). Consequently, blade 202 is withdrawn from the position of FIGS. 10 through 12 to the position of FIG. 13 as the capacitor 38 is deposited upon the output carrier strip 48 and the indexing wheel 46. A downward ramp 202A which is formed at the tip of the blade 202 facilitates this final withdrawal of the blade.

During the subsequent rearward return of the puller tool drive bars 106 and 108, the blade 202, arm 204, shaft 205 and driven link 208 are returned to their initial positions by the retraction of the upper drive bar 106B relative to the lower drive bar 108B, which occurs when the rocking drive link 146 returns to the position illustrated in FIG. 23 as previously described.

During this concluding phase of the capacitor extraction operation the withdrawal rotation of the puller tool 110 (illustrated in FIG. 13) lifts the restraining bar 128 from the upper surface of the capacitor leads 116. At this point a third capacitor restraining means in the form of an upper blade 230 is applied over the upper surface of the capacitor leads 116 to take the place of the bar 128, and thus to keep the capacitor from falling off the indexing wheel 46. See FIGS. 1-4B, 13, and 17A. This blade 230 is secured (by a bolt 231; see FIG. 17C) at the end of a carrier arm 232 which is secured to an angle arm 234 by means of fasteners 236. The arms 232 and 234 pivot (see arrow 247) as a unit about a pin 238 supported upon a block 240 (FIGS. 17A-C). The block 240 is secured by bolts 241 to bracket 242, which in turn is secured to the front plate 30 by a bracket 244 (FIGS. 2-4). An upright extension 234A of arm 234 has an adjustable bolt 246 threaded therein, which receives an impact to cause pivotal motion of arms 232 and 234 about pivot 238. Another bolt 247 (FIG. 17C) is threaded in the block 240 and is adjustable to establish the limit position of arm 234 when the latter pivots in response to such impact.

When the puller tool drive mechanism reaches the forward extremity of its stoke, block 206 (FIGS. 18A, B and C), secured to the puller tool drive bar 108B by bolts 207 strikes against the impact bolt 246. (See also FIG. 17A) This causes the extension 234A and arms 234 and 232 to rotate about pivot pin 238. Such rotation brings the upper restraining tongue 230 into operative position against the top surface of the capacitor leads 116 (see arrow 248).

Figure 13:
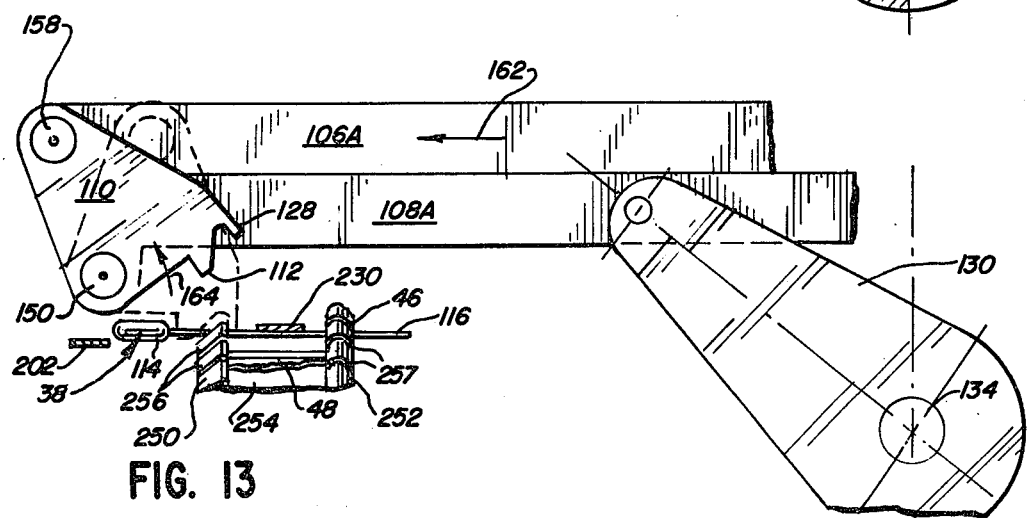
FIG. 13 is similar to FIG. 12, except that it shows the puller tool and actuating linkage at a time when the component has been deposited upon the output carrier strip and the puller tool has been withdrawn from engagement therewith.
Figure 14:
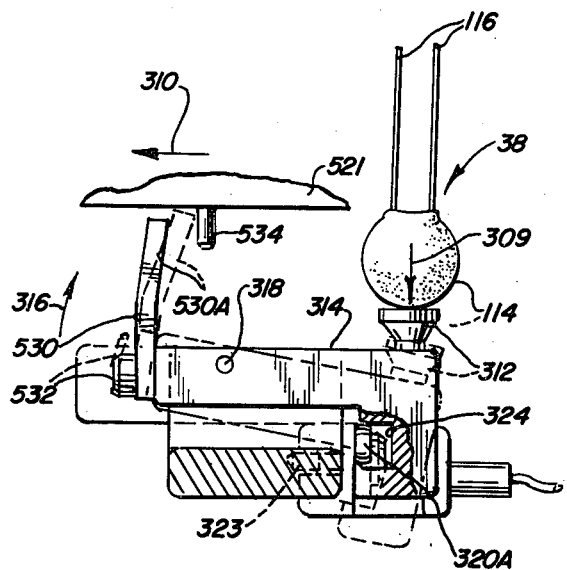
FIG. 14 is a top plan view of the mechanism for sensing the removal of a component.
Figure 15:
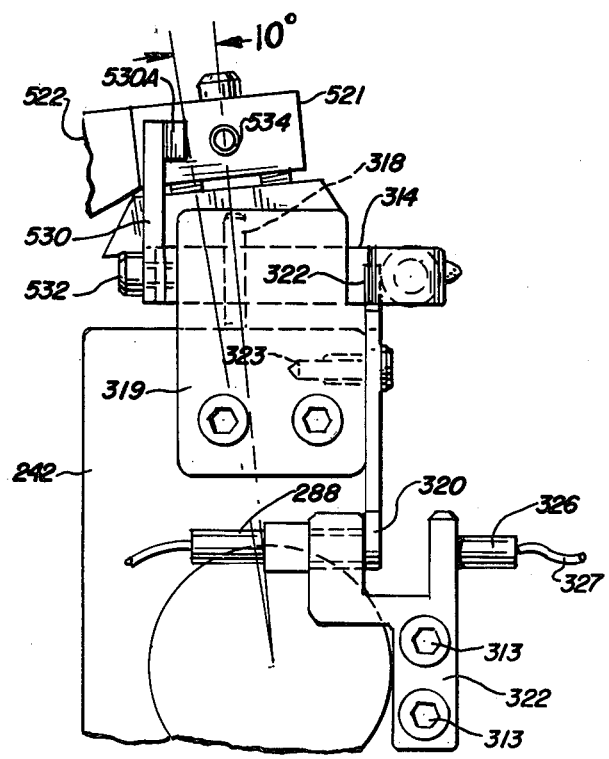
FIG. 15 is a front elevational view of the same mechanism.
Figure 16:
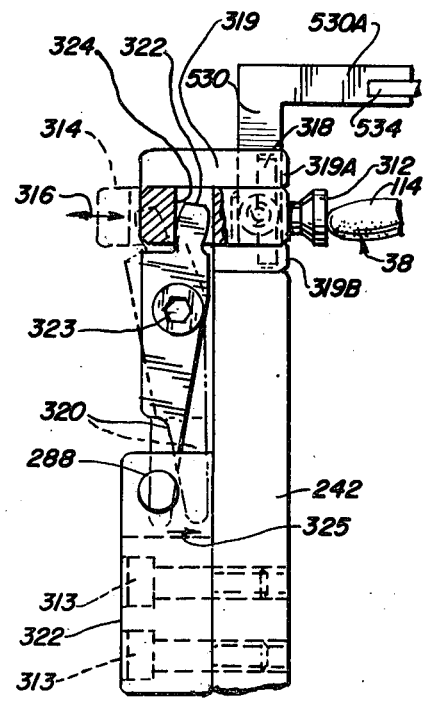
FIG. 16 is a side elevational view of the same mechanism.
Figure 18A:
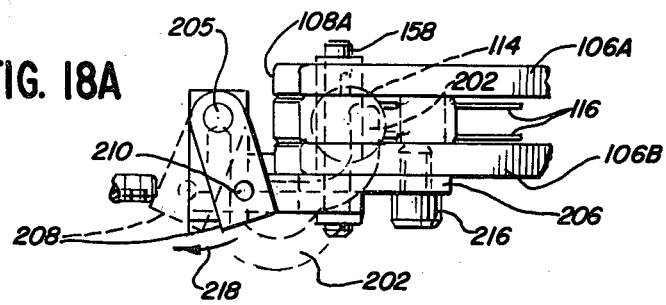
FIG. 18A is a top plan view of the lower component restraining mechanism of this machine.
Figure 18B:
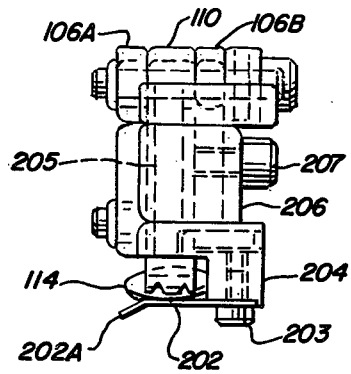
FIG. 18B is a front elevational view of the same mechanism.
Figure 18C:
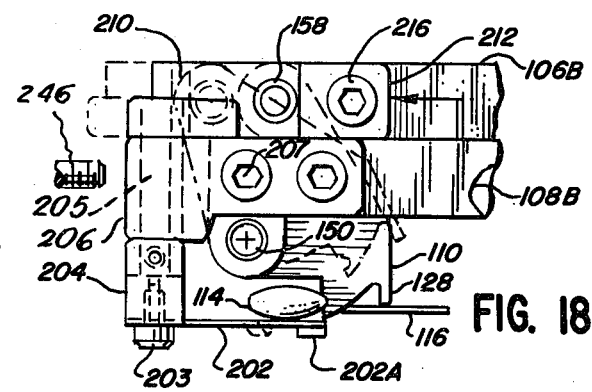
FIG. 18C is a side elevational view of the same mechanism.

The indexing wheel 46 is provided with flanges 250 and 252 on either side thereof, which define therebetween a depressed central track 254 within which the output carrier strip 48 is nested. See FIGS. 13 and 21A. The flanges 250 and 252 are provided with pairs of grooves 256 and 257 respectively (see FIGS. 2, 3 and 4) which accomodate the pairs of capacitor leads 116 so that the leads are able to lie flush against the output carrier strip 48 and down within the recessed track 254 as seen in FIG. 13.

The indexing wheel, driven by a mechanism to be described shortly, rotates incrementally in the direction indicated by arrow 258 in FIGS. 1 and 2. As this wheel rotates, the entrapment of the capacitor leads 116 within the grooves 256 and 257 cause the indexing wheel flanges 250 and 252 to drive the capacitors 38 in the direction of rotation of the wheel. As best seen in FIG. 21A, the upper restraining blade 230 is sufficiently elongated so that, during the time that bar 232 is rotated into operating position and the blade 230 overlies the capacitor leads 116, the blade continues to hold down the capacitor leads 116 and thus prevent the capacitor 38 from falling off the indexing wheel 46. Before the rotation of the indexing wheel 46 can cause the capacitor 38 to escape beyond the distal end of the blade 230, the capacitor comes under the restraining influence of guide shoe 56 (FIGS. 1, 20 and 21). This show has an arcuate surface 56A conforming closely to the circumference of the indexing wheel 46, and is bifurcated at its upstream end to form a fork 56B with two prongs which straddle the distal end of the blade 230. Thus, elements 230 and 56B overlap along the direction of capacitor travel so that, by the time a capacitor 38 comes to the end of the blade 230, the capacitor restraining function has been taken over by the fork 56B and guide shoe 56.

The guide shoe 56 is movably mounted upon an angularly oscillating bracket 522. The shoe is biased against the indexing wheel flanges 250, 252 (FIG. 13) by a pair of compression springs 520 reacting against a horizontal forward extension 521 of bracket 522. A stripper bolt 524 (i.e., an unthreaded shank with a threaded tip at one end and a bolt head at the other end) passes loosely through the shoe 56 to keep it from being displaced laterally from the bracket extension 521. The shoe 56 participates in the oscillation of the bracket, causing it to rotate with the indexing wheel 46 in the direction indicated by arrow 258, and then return. As a result of this stroke, the shoe moves with each successive capacitor 38 and holds it in place on the indexing wheel 46 until that capacitor comes under the re-taping wheel 74 and is therefore in position to be taped in place upon the output carrier strip 48 by tape 60. This is an additional advantageous feature of the invention, since it makes sure that there is no time when a capacitor 38 can escape from the indexing wheel 46 because it is not restrained by either the shoe 56 or the tape 60.

The spring pressure which the shoe exerts does not affect the output strip 48 or the capacitors 38 thereon, since the strip and the capacitor leads 116 are nested in the depressed track 254 between the flanges 250 and 252. The leads 116 are also captured in the grooves 265 and 257 (FIG. 3). The capacitor heads 114, on the other hand, project forwardly from the indexing wheel 46 (see FIGS. 1, 13 and 12), and so are not in the path of the shoe 56.

As each successive capacitor 38 is indexed within the reach of fork 56B by wheel 46 (FIGS. 20 and 21), the restraining tongue 230 is no longer needed to hold down the capacitor leads 116, and indeed it must be returned to its original position in order to make room for the next capacitor. Therefore, arm 204 (FIGS. 18B and C), which reciprocates with the puller tool drive bar 108B, strikes a rounded surface 232 A of arm 232 during the puller tool withdrawal stroke; and this impact returns the arms 232 and 234 and therefore the tongue 230 to their initial positions to await the next capacitor pulling cycle.

Referring once again to FIG. 23, which shows the overall power train of this machine, the main drive shaft 170 drives an auxiliary shaft 270 by means of a pair of gears 272 and 274. This auxiliary shaft drives a wrap spring clutch 276, which is identical to the wrap spring clutch 190 previously described. The clutch is triggered by a solenoid 278 actuating a clutch release pawl 280. The release signal for the solenoid 278 arrives over a line 282 from a controller circuit 284. The latter in turn is triggered by a signal arriving on a line 286 from a capacitor detecting photocell 288 which is arranged to sense when a capacitor 38 has been successfully transferred to the indexing wheel 46.

Each time that the solenoid 278 actuates the pawl 280, the wrap spring clutch drives a shaft 290 through a single rotation. This shaft turns a crank 292 which drives a pair of connecting rods 294 and 296. See also FIGS. 24 and 25. The first connecting rod 294 is connected by a pin 295 and a link 293 to a cradle 299, which is rotatably mounted on a shaft 302 in front of the front plate 30 of the machine (FIG. 1). Since the cradle 299 is on the front side of plate 30, and member 290, 292, 294 and 295 are on the rear side, the link 293 passes through a window 30A formed in the plate 30 and establishes a horizontal connection between rod 294 and cradle 299. The motion imparted to the cradle 299 by the connecting rod 294 and link 293 is a ten degree increment of rotation in the direction of arrow 300, followed by a ten degree return rotation in the opposite direction. The window 30A is large enough to permit such an excursion by the link 293. The indexing wheel 46 is pinned to the shaft 302, which in turn is journaled on plate 30 to permit indexing rotation of the wheel 46. As the cradle rotates in the direction indicated by arrow 300, a pawl 306 mounted on link 293 imparts the same ten degree increment of rotation to a ratchet wheel 308. This causes the ratchet wheel to move through a ten degree increment of rotation in the direction indicated by arrow 310. The ratchet wheel 308 is pinned to shaft 302, thus causing the ten degree increment of rotation to be imparted to the indexing wheel 46. When the cradle 299 returns ten degrees in the opposite direction, however, the cradle rotates relative to shaft 302 and the pawl 306 ratchets back over the teeth of wheel 308. Thus cradle 299 does not return the ratchet wheel 308, shaft 302, or indexing wheel 46 to their original positions. Consequently the angular oscillation of cradle 299 is converted to unidirectional incremental rotation of indexing wheel 46, indicated by arrow 258 in FIGS. 1 and 20.

As seen in FIGS. 2, 14, 15, 16, and 23, when a capacitor 38 is deposited upon the indexing wheel 46, it strikes an impact button 312 mounted on a carrier bar 314. This causes the bar to rotate in the direction indicated by arrows 316 about a pivot pin 318. This pin is journaled in upper and lower portions 319A and B of a support block 319, which is mounted on bracket 242. See also FIG. 1. The pivotal motion of bar 314 is coupled to a shutter 320 by means of a cog extension 320A which is received within a recess 324 formed in the bar 314. The shutter 320 then rotates (see arrow 325) about a pin 323 which pivotally mounts the shutter upon support clock 319. The support block is bolted to bracket 242 (see also FIG. 1). Rotation of the shutter causes it to be interposed in the path of light aimed at the photocell 288 by a light source 326 supplied with electrical power by a wire 327. Both the photocell 288 and light source 326 are mounted upon a Y-shaped bracket 322 which is secured by bolts 313 to bracket 242.

When the shutter unblocks the light beam, a capacitor detection signal is sent by the photocell 288 over line 286 to the controller circuit 284, which then sends a solenoid energization signal over line 282 to the solenoid 278. The solenoid then releases the pawl 280 and initiates a cycle of operation of the wrap spring clutch 276, thus causing the indexing wheel 46 to be advanced through a ten degree increment of rotation. This removes the most recently delivered capacitor 36 from repackaging station 47 (FIG. 1), and indexes the wheel to receive the next capacitor.

Each time a capacitor is detected by photocell 288, circuit 284 also sends an impulse over a line 600 to an electronic counter 602, which thus counts the number of capacitors being loaded onto the output strip 48. Counter 602 can be set for a predetermined number of capacitors, and when that number is reached, counter 602 automatically shuts off the control circuit 166, depriving motor 164 of power and thus shutting off the machine.

In order to return the carrier bar 314 to its initial position at the end of each capacitor detection and indexing cycle, a vertical impact bail 530 is secured at one end of the bar by a bolt 532 and is formed with a horizontal extension 530A (FIGS. 1, 14–16 and 21). The extension is interposed in the path of a drive pin 534 mounted on extension 521 of bracket 522. The latter is positioned directly above cradle 299, and secured by a stripper bolt 523 to a block 298, which in turn is secured by bolt 536 to cradle 299 (see FIGS. 23 and 25). Since the cradle 299 oscillates through a ten degree excursion during each capacitor removal cycle, block 298, bracket 522, and its extension 521 oscillate with it. The first half of the oscillation causes drive pin 534 to engage extension 530A of bail 530, thus pivoting bar 314 back to its solid line position of FIG. 14. This happens at the end of each capacitor removal cycle, and thus restores the initial conditions for the start of the next cycle.

The output carrier strip 48 comes off supply reel 50 (FIG. 1) and is fed to the index wheel 46 at a location just ahead of the repackaging station 47. The feed direction is indicated by arrow 49. A guide roller 400 is rotatably mounted upon a pin 402 and supported by a link 404. The link, in turn, is pivotably mounted by means of a pin 406 upon a mounting block 408 secured to the front panel 30. The link 404 is biased toward indexing wheel 46 by means of a conventional coil spring 409 received within a blind hole formed in the link 404. The spring is in compression between link 404 and an extension 408A of the mounting block 409, which receives the opposite end of the spring within another blind hole. Thus the guide roller 400 keeps the output carrier strip 48 pressed against the indexing wheel 46.

Strip 48 passes over the top of the indexing wheel 46, so that the successive capacitors 38 are placed on top of the strip. Then the strip, with the successive capacitors 38 thereon, passes under the guide shoe 56 and approaches the retaping station 58. The tape 60 used to secure the capacitors to the output carrier strip may be of the pressure-sensitive type, or of the thermal type. It comes off a supply reel 62 and is fed in the direction of arrow 410 over a guide roller 412 to the retaping wheel 74. The guide roller 412 is mounted on a shaft 414 journaled in the front plate 30.

Figure 25:
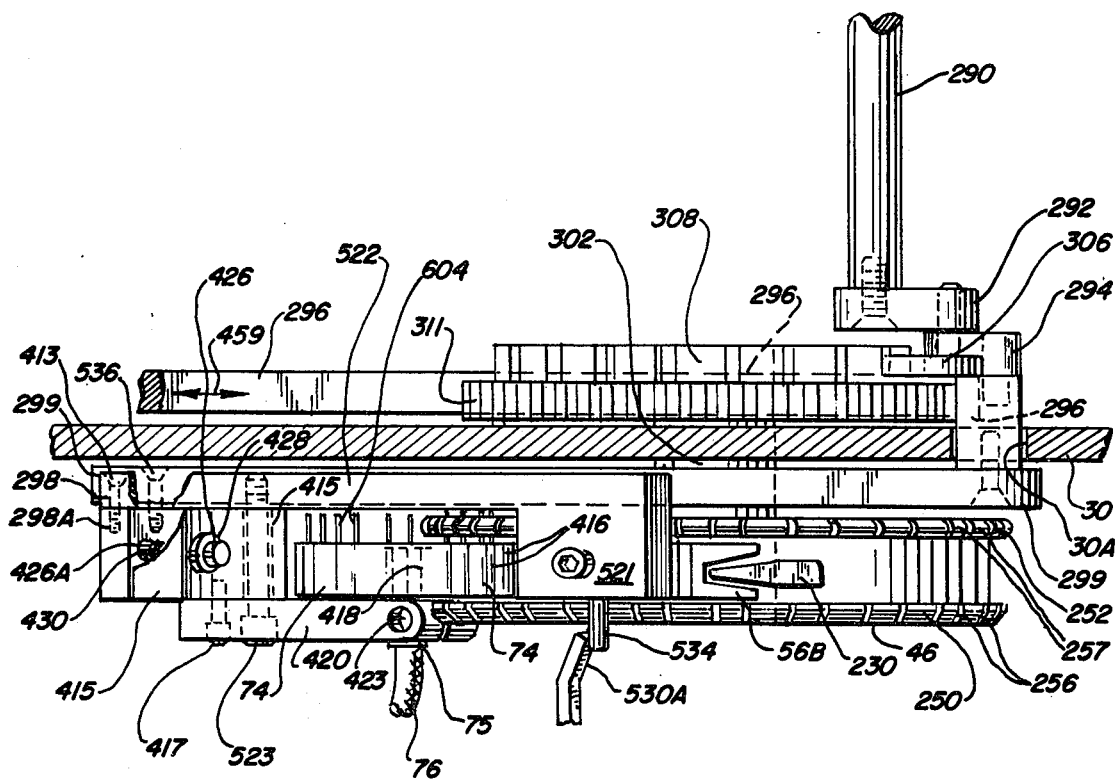
FIG. 25 is a top plan view of a portion of the retaping machine.

As best seen in FIGS. 20 and 25, the retaping wheel 74 has pairs of grooves 416 formed across its outer periphery to accommodate the pairs of capacitor leads 116. The wheel 74 is rotatably mounted upon a shaft 418 which in turn is supported between two bearing plates 419 and 421. These two bearing plates are pinned together by bolts 417, and are rotatably secured to the oscillating cradle 299 by stripper bolt 523. See also FIGS. 23 and 25. Thus, stripper bolt 523, bearing plates 419 and 421, shaft 418 and re-taping wheel 74 all oscillate through a ten degree stroke with cradle 299. This causes the wheel 74 to roll over the tape 60, capacitors 38 and carrier strip 48 upon the indexing wheel 46 during each oscillation of cradle 299, for the purpose of pressing the tape 60 into adhesion with the capacitor leads 116 and strip 48.

A bar 298A secured by a bolt 413 to member 298 engages a biasing plunger 426 received within a cylindrical recess 415A formed on a bracket 415 secured to bearing plates 419 and 421 by bolts 417. The bracket 415 rotates, along with bearing plates 419 and 421, around stripper bolt 523. A compression spring 430 surrounds the plunger 426 and is trapped between a washer 428 which is snapped into a groove formed on the plunger 246 and a broadened plunger tip 246A. As a result, the spring 430 exerts a force on the plunger 426 and thus upon bar 298A which tends to rotate bracket 415 and bearing plates 419 and 421 in the direction (arrow 431) to keep the retaping wheel 74 pressed against the adhesive tape 60, the capacitors 38, the output strip 48, and the indexing wheel 46. The pressure exerted by the wheel 74 serves to force the tape 60 into engagement with the capacitor leads 116 and the output strip 48, so that the capacitors are taped to the output strip.

Dowel pins 604 extend rearwardly from the retaping wheel 74 and mesh with teeth which are formed on rear flange 252 of the indexing wheel 46. In effect, the circumference of flange 252 is greater than that of flange 250; and in particular flange 252 is extended, in the regions between grooves 257, radially outwardly far enough so that pins 604 are trapped in the grooves 257, above the capacitor leads 116 which are also received in these grooves. This geared connection between the retaping wheel 74 and the indexing wheel 46 insures that the retaping wheel rotates in synchronism with the indexing wheel.

If the tape 60 is of the thermal type, electrical power supplied by a wire 76 (FIG. 1) energizes a heating element 75 received within a central bore of shaft 418. The heating element thus heats the shaft 418 and the retaping wheel 74 to make the thermal tape adhere. The temperature of the wheel 74 is read out upon a panel meter 78.

The shaft 418 is held in place by a forked clamp 429. The clamp's forked end is tightened by a bolt 42, and the clamp is secured to bearing plate 419 by bolts 425.

Figure 19:
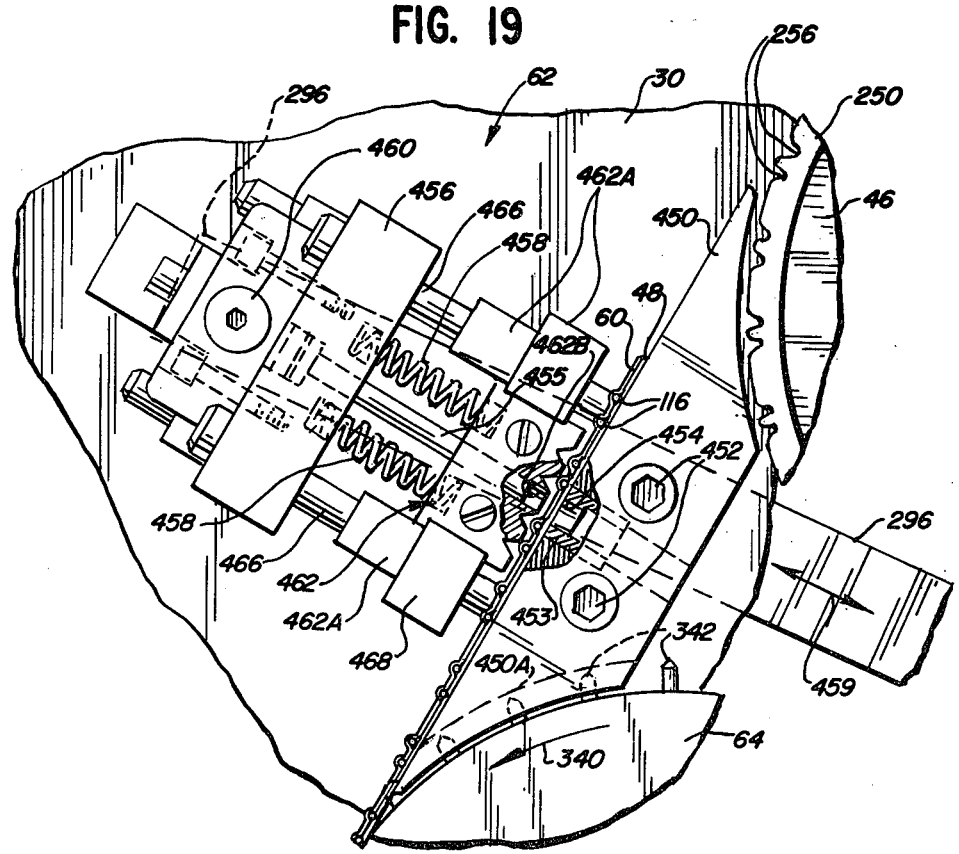
FIG. 19 is a front elevational view of the sprocket hole punching mechanism of this machine.

As the output carrier strip 48 leaves the retaping station 58 it enters the sprocket hole punching station 62. As seen in FIGS. 1 and 19, an anvil 450 is mounted to the front plate 30 by means of bolts 452 at a location between the indexing wheel 46 and the sprocket drive wheel 64. The anvil is grooved at 450A to accommodate sprocket pins 342, and is also formed with a recess in which is received an insert 453 formed with a punch-receiving hole 454. A punching tool 455 is driven repeatedly into this hole by a driver 456. The latter is mounted upon, and driven by, longitudinally reciprocating rod 296 (see also FIG. 23), as indicated by arrows 459. The link is connected to the driver 456 by a pivot pin 460.

As previously explained in connection with FIG. 23, the rod 296 is actuated once per cycle by the crank 292, shaft 290 and wrap spring clutch 276. The timing of the punching operation is such that punching tool 455 comes down once between each adjacent pair of capacitors 38. As a result, sprocket holes 469 (FIG. 1) are formed in the strip 48 and tape 60, and later mesh with sprocket pins 342 on the sprocket drive wheel 64.

Springs 348 are connected between the driver 456 and a stripper block 462, the purpose of which is to hold down the carrier strip 48 and tape 60 as the punch 455 is withdrawn. Guide pins 466 are secured to the anvil 450 and project upwardly therefrom, passing slidably through bores formed in extensions 462A of stripper block 462 and also through bores formed in the driver 456. Thus pins 466 guide the reciprocating motion of driver 456, and also retain the stripper block 462 in place. The springs 458 act in compression to keep the stripper block pressed against the tape 60 and strip 48 as the punch 455 moves downwardly within a bore 462B formed in the stripper block 462 and punches a sprocket hole. As the punch reverses its motion and starts upwardly, the springs 458 initially continue to keep the stripper block 462 pressed against the tape 60 and strip 48 so that the punch 455 can pull free thereof. But after the punch has succeeded in pulling free, the upward motion of the driver 456 extends the springs 458 to such an extent that stripper block 462 is momentarily lifted off the tape 60 and strip 48, thus permitting the latter to be advanced incrementally to the next sprocket hole punching position by the sprocket wheel 64.

As seen in FIG. 23, this sprocket wheel is driven by a gear 334 coaxially secured thereto. The sprocket wheel and gear 334 rotate jointly about a shaft 336 (see also FIG. 1) which is journaled upon the front panel 30 of the machine. Power for the gear 334 comes from gears 332 and 311. Gear 332 is journaled upon a shaft 338 which in turn is mounted to the front panel 30. Gear 311 is located behind the front plate 30 (see also FIG. 25), and is pinned to the same shaft 302 which drives the indexing wheel. This positively synchronizes the sprocket wheel to the indexing wheel, since both are driven intermittently by the pawl 306 and ratchet wheel 308. The direction of rotation of sprocket wheel 64 is indicated by arrows 340 in FIGS. 1, 19 and 23.

The output carrier strip is held against the sprocket wheel 64 by a roller 460 which is formed with a groove 472 deep enough to accommodate the sprocket pins 342. This roller is rotatably mounted by a shaft 474 upon a link 476. The link in turn is pivotally mounted by means of a shaft 478 upon a mounting block 480 secured to the front panel 30. A conventional coil spring 481 reacts between link 476 and an angled extension 480A of the mounting block to keep the roller 470 biased against the output carrier tape and the sprocket wheel. Spring 481 has its opposite ends received within respective blind holes formed in link 476 and extension 480A.

The distal ends of the capacitor leads 116 are not cut away until after they have finished serving as a drive coupling to the indexing wheel 46, by meshing with grooves 256 and 257 at flanges 250 and 252. As best seen in FIGS. 22 and 23, a cutter blade 360 is rotatably driven by means of a shaft 361 and a gear 366. Power for gear 366 is taken from gear 334 by gears 362 and 364 (FIG. 23). These gears are rotatably mounted upon the front plate 30 by means of respective shafts 363 and 365. The cutter blade is secured by bolts 500 to a spacer member 502, which in turn is pinned by means of a pin 504 to shaft 361. A bearing block 506 secured to the front plate 30 by bolts such as 510 cooperates with a bearing 511 to journal the shaft 361 upon the front plate 30. Another bearing block 508 is mounted rearwardly of the front plate by means of bolt 510 and a spacer 512; and this second bearing block 508 cooperates with bearing 509 and bushing 507 to journal the opposite end of shaft 361. The gear 366 is connected by key 367 to the shaft 361 and an intermediate bushing 514. The severed ends of the capacitor leads 116 (FIG. 1) fall into a bin (not shown).

After the cutting operation is completed, the output carrier strip passes under the guide shoe 68, is interleaved with paper ribbon 72, and is wound up upon take-up reel 70 in the direction indicated by arrows 492. Reel 70 is driven by a conventional slip clutch (not shown) in the direction indicated by arrow 494.

The drive train includes a hand wheel 368, seen in FIGS. 1, 2 and 23, which is mounted on the end of the main drive shaft 170, and is accessibly located on the outer side of the front plate 30. When rotated in the direction indicated by arrow 370, this hand wheel operates the entire power train at low speed. This makes it useful for threading the output carrier strip 48 and adhesive tape 60 through the machine at the time it is initially set up for operation. The hand wheel is also useful for trouble shooting, during maintenance and repair.

In setting up this machine the output carrier strip 48 and adhesive tape 60 are threaded through the path illustrated in FIG. 1, while using the hand wheel 368 to advance the mechanism. Then the output strip 48 and tape 60 are interleaved with the paper strip 72 and connected to the reel 70. As the strip 48 and tape 60 are threaded through the punching station 62, sprocket holes 469 are formed therein due to the operation of the punching mechanism by the hand wheel 368. Once this is accomplished, the sprocket wheel 64, because of the positive engagement between the sprocket pins 342 and the sprocket holes 469, provides positive feed for the strip 48 and adhesive tape 60 during all subsequent operations of the machine. Moreover, the sprocket drive is positively synchronized with the indexing of the wheel 46 through the intermittent indexing and advancing mechanism described. As each input strip 34 is fed into the machine, the capacitor pulling mechanism cycles once for each capacitor detected and extracted from the input strip. The indexing wheel 46 and sprocket drive wheel 64 advance intermittently, and each step in the advance is undertaken only when a capacitor has been successfully extracted from the input strip 34 and loaded onto the output strip 48 and the indexing wheel 46. In this way, the capacitors 38, although initially arranged with capacitorless gaps 80 therebetween on the input strip 34, are nevertheless retaped without any such gaps on the output strip 48.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

The invention claimed is:

1. A machine for repackaging components, comprising:

means for receiving an input carrier having at least one component releasably secured thereto, said component including at least one lead;

a repackaging station;

means for advancing an output carrier strip lengthwise through said repackaging station, said strip having a width smaller than the length of said component lead;

said strip advancing means including indexing means in juxtaposition with said strip and motive means for displacing said indexing means lengthwise of said strip;

means for removing said component from said input carrier and depositing it upon the portion of said strip which is juxtaposed to said indexing means;

means for securing said component to said strip;

means for advancing said strip in response to said displacement of said indexing member;

means, located adjacent the path of advancement of said strip and downstream of said repackaging station relative to the direction of said advancement, for forming sprocket holes in said strip at lengthwise-spaced locations thereon;

sprocket drive means located adjacent said path and downstream of said sprocket hole forming means relative to said direction of advancement, said sprocket drive means having sprocket pin means adapted to engage successive ones of said sprocket holes and means for displacing said sprocket pin means to assist in said advancement of said strip;

and means, located adjacent said path and downstream of said sprocket drive means relative to said direction of advancement, for severing said lead close to one edge of said strip.

2. A machine for repackaging components, comprising:

means for receiving an input carrier having at least one component releasably secured thereto, said component including at least one lead;

a repackaging station;

means for advancing an output carrier strip lengthwise through said repackaging station, said strip having a width smaller than the length of said component lead;

said strip advancing means including indexing means in juxtaposition with said strip and motive means for displacing said indexing means lengthwise of said strip;

the surface of said indexing means which is juxtaposed to said strip having a dimension widthwise of said strip which is greater than the width of said strip, and having groove means extending across said juxtaposed surface thereof in a direction widthwise of said strip and position on each side of said strip;

means for removing said component from said input carrier and depositing it upon the portion of said strip which is juxtaposed to said indexing means with said component lead oriented widthwise of said strip and extending beyond both edges of said strip and received within said groove means on both sides of said strip whereby said indexing means is coupled to said component;

means for securing said component to said strip whereby said component contributes to the advancement of said strip in response to said displacement of said indexing member;

means, located adjacent the path of advancement of said strip and downstream of said repackaging station relative to the direction of said advancement, for forming sprocket holes in said strip at lengthwise-spaced locations thereon;

sprocket drive means located adjacent said path and downstream of said sprocket hole forming means relative to said direction of advancement, said sprocket drive means having sprocket pin means adapted to engage successive ones of said sprocket holes and means for displacing said sprocket pin means to assist in said advancement of said strip;

and means, located adjacent said path and downstream of said sprocket drive means relative to said direction of advancement, for severing said lead close to one edge of said strip.

3. A machine for repackaging components, comprising:

means for receiving an input carrier having at least one component releasably secured thereto;

a repackaging station;

means for advancing an output carrier strip lengthwise through said repackaging station;

said strip advancing means including indexing means adapted to underlie said strip in said repackaging station, means oscillating through a selected angular stroke, and unidirectional transmission means connecting said oscillating means to advance said indexing means through a selected increment for each half cycle of said oscillating means;

means for removing said component from said input carrier and depositing it upon said output carrier strip within said repackaging station;

means dispensing adhesive tape to secure said component to said output carrier strip;

retaping wheel means;

means rotatably mounting said retaping wheel means over said adhesive tape, component, output carrier strip, and indexing means;

and means connecting said retaping wheel mounting means to said oscillating means to cause said retaping wheel means to roll over said adhesive tape to make it adhere to said component and output carrier strip.

4. A machine as in claim 3 further comprising means connecting said retaping wheel means to said indexing means in a manner to synchronize the rotation of said retaping wheel means with the advance of said indexing means.

5. A machine as in claim 4 further comprising a gear means connected to rotate in synchronism with the advance of said indexing means, and means connected to said retaping wheel means and meshing with said gear means to synchronize the rotation of said retaping wheel means with the rotation of said gear means.

6. A machine for repackaging components, comprising:

means for receiving an input carrier having at least one component releasably secured thereto;

a repackaging station;

means for advancing an output carrier strip lengthwise through said repackaging station;

said strip advancing means including indexing means adapted to underlie said strip in said repackaging station, means oscillating through a selected angular stroke, and unidirectional transmission means connecting said oscillating means to advance said indexing means through a selected increment for each half cycle of said oscillating means;

means for removing said component from said input carrier and depositing it upon said output carrier strip within said repackaging station;

guide means in said repackaging station adapted to overlie said component to keep it in place upon said strip;

means, located downstream from said guide means relative to the direction of advance of said indexing means, for securing said component to said strip;

and means connecting said guide means to said oscillating means to cause said guide means to move with said indexing means as said indexing means advances whereby to keep said component in place upon said strip as said component travels downstream toward said securing means.

7. A machine as in claim 6 further comprising:

restraining means effective to engage said component from above when it is deposited upon said strip;

said restraining means and said guide means being arranged to overlap each other in the direction of travel of said indexing means so said component is not left unrestrained therebetween.

* * * * *